(12) United States Patent
Yang

(10) Patent No.: US 6,750,753 B2
(45) Date of Patent: Jun. 15, 2004

(54) FUSE STRUCTURE WINDOW

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/385,985

(22) Filed: Mar. 10, 2003

(65) Prior Publication Data

US 2004/0012476 A1 Jan. 22, 2004

(30) Foreign Application Priority Data

Jul. 19, 2002 (TW) .................... 91116117 A

(51) Int. Cl.⁷ .............. H01H 85/046; H01H 85/08; H01L 27/115; H01L 29/00
(52) U.S. Cl. ............. 337/297; 337/160; 337/290; 337/296; 337/405; 257/209; 257/529; 365/225.7
(58) Field of Search .............. 337/5, 297, 296, 337/290, 298, 159–161, 401, 404, 405, 416, 417; 257/50, 209, 529, 530, E23.147, E23.149, E21.592; 365/225.7

(56) References Cited

U.S. PATENT DOCUMENTS

| | | | | |
|---|---|---|---|---|
| 4,751,197 A | * | 6/1988 | Wills | 438/600 |
| 5,821,160 A | * | 10/1998 | Rodriguez et al. | 438/601 |
| 5,828,599 A | * | 10/1998 | Herdt | 365/185.08 |
| 5,949,323 A | * | 9/1999 | Huggins et al. | 337/401 |
| 6,008,716 A | * | 12/1999 | Kokubun | 337/297 |
| 6,100,117 A | * | 8/2000 | Hao et al. | 438/132 |
| 6,180,503 B1 | * | 1/2001 | Tzeng et al. | 438/601 |
| 6,255,715 B1 | * | 7/2001 | Liaw | 257/529 |
| 6,294,474 B1 | * | 9/2001 | Tzeng et al. | 438/710 |
| 6,333,545 B1 | * | 12/2001 | Ema | 257/529 |
| 6,461,797 B1 | * | 10/2002 | Lercel et al. | 430/318 |
| 6,489,227 B1 | * | 12/2002 | Hsieh et al. | 438/601 |
| 6,649,997 B2 | * | 11/2003 | Koike | 257/529 |
| 6,656,826 B2 | * | 12/2003 | Ishimaru | 438/612 |
| 6,677,226 B1 | * | 1/2004 | Bowen et al. | 438/601 |
| 6,683,365 B1 | * | 1/2004 | Trivedi | 257/530 |

FOREIGN PATENT DOCUMENTS

JP        07273200 A    *  10/1995  ........ H01L/21/82

* cited by examiner

*Primary Examiner*—Anatoly Vortman
(74) *Attorney, Agent, or Firm*—Ladas & Parry

(57) ABSTRACT

The present invention provides a fuse structure. The fuse structure comprises a substrate, a plurality of conductive layers, a dielectric layer and a plurality of conductive plugs. The fuse structure includes a plurality of fuse units, with increased the pitch between the fuse units. This structure prevents the fuse structure from failing when both misalignment of the laser beam or thermal scattering of the laser beam damage the second layer of the fuse structure in the laser blow process, which raises reliability and yield.

19 Claims, 6 Drawing Sheets

FUSE STRUCTURE WINDOW

BACKGROUND OF THE INVENTION

1. Field of the Invention

The present invention relates to a fuse structure, and in particular fuse structure that can avoid damage from the laser blow process in its laser spot.

2. Description of the Related Art

Fuses are routinely used in the design of monolithic integrated circuits (IC). Fuses are programming elements for the product after monolithic integrated circuit manufacture programming.

It is well known that random access memories (RAM) are designed with redundancies which include spare columns, rows, or even fully functional arrays, wherein when any element fails, the defective row, column and the like are replaced by a corresponding element. Disabling and enabling of spare elements is accomplished by fuses which are blown when required, preferably, by a laser beam.

Additionally, the technique of laser fuse deleting (trimming) has been widely used both in the memory and logic IC fabrication industries, as an effective way to improve functional yields and to reduce development cycle time. Yet, fuse blow yield and fuse reliability have been problematic in most conventional fuse designs.

FIG. 1 is a sectional view of a traditional fuse structure, FIG. 2 is a top view of a traditional fuse structure, and FIG. 1 shows a cross section C–C' of FIG. 2.

Referring to FIG. 1, symbol 100 shows a substrate having a laser spot 110. A metal layer M0 is formed on part of the substrate 100. A metal layer M1 is formed on part of the oxide layer, between the metal layer M0 and metal layer M1 having a oxide layer 120. A conductive plug 130 penetrating the oxide layer 120 electrically connects the metal M0 layer and M1 layer. A laser spot 110 on part of the metal M1 layer and the top of a part of the oxide layer 120 forms a fuse window 140. The symbol 150 is a passivation layer.

Referring to FIG. 2 is a top view of FIG. 1. There are plural fuse structures 210, 220, 230, 240 in fuse window 140. Each fuse structure comprises the M0 layer, the conductive plug 130 and the M1 layer. The solid line area shows the M1 layer, the dashed line area shows M0 layer, and each fuse structure comprises its own optimal laser spot 11. To give an example, a laser beam 290 blows the position 110 of the fuse structure 220. Because of misalignment of the laser beam 290 or thermal scattering of the laser beam 290, thermal shock from the laser blow process can damage the M0 layer. This can cause the fuse structures to crack, seriously affecting device reliability and yield.

SUMMARY OF THE INVENTION

Accordingly, an object of the invention provides a fuse structure comprising a substrate, a plurality of conductive layers, a dielectric layer and a plurality of conductive plugs in a new arrangement, increasing the distance between different fuse units.

Another object of the invention provides a fuse window having a plurality of fuse structures, each of the fuse structures comprising a substrate, a plurality of conductive layers, a dielectric layer and a plurality of conductive plugs. The fuse units do not electrically connect to each other.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 3A:
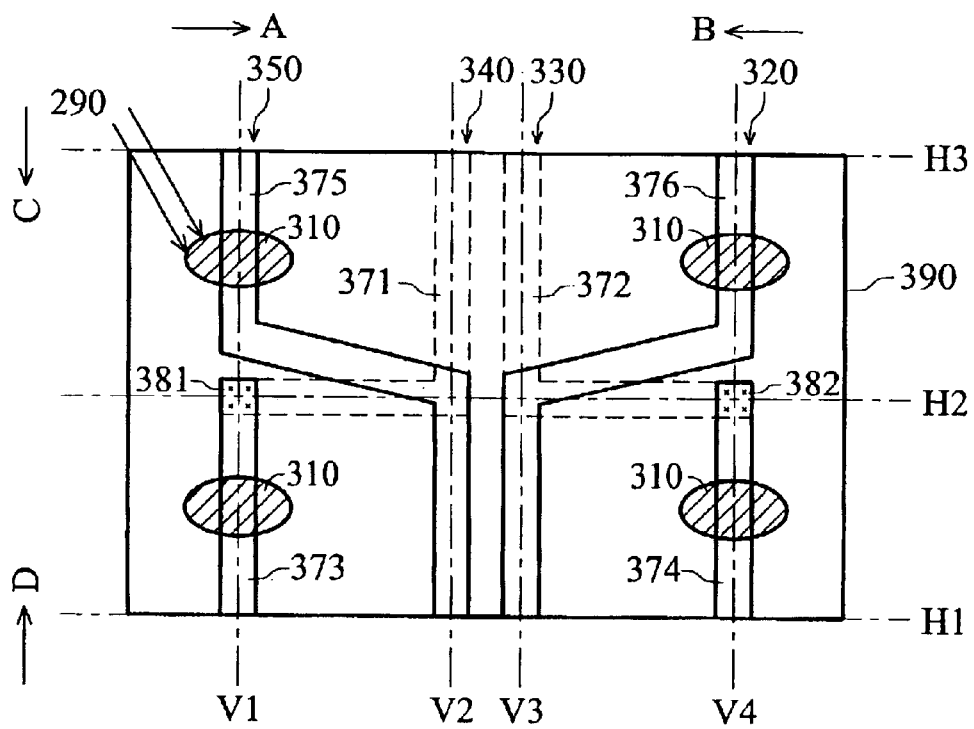
FIGS. 3A, 4A are top views of fuse window of the present invention.
Figure 3B:
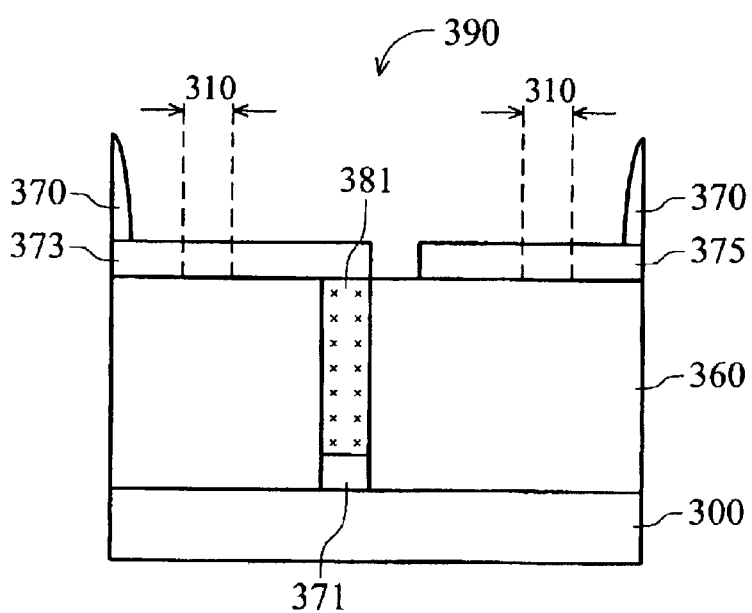
FIGS. 3B, 3C and 3D are sectional views of the FIG. 3A.
Figure 3C:
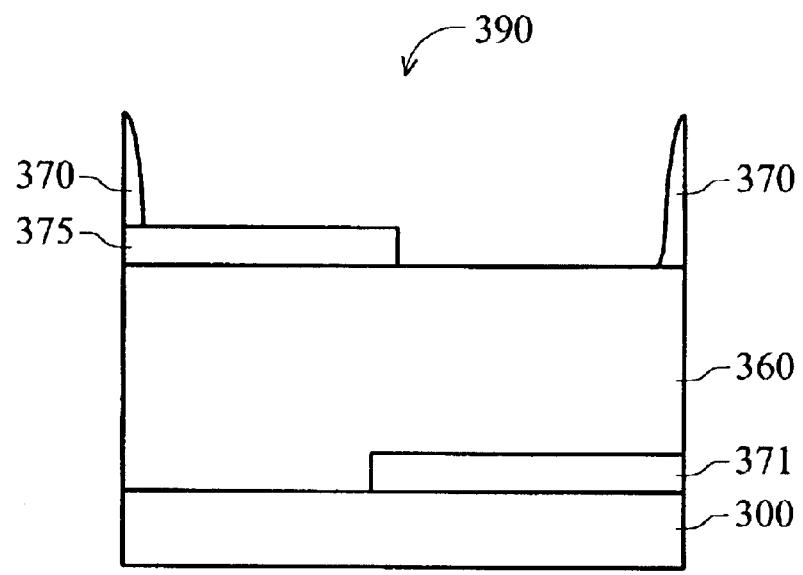
Figure 3D:
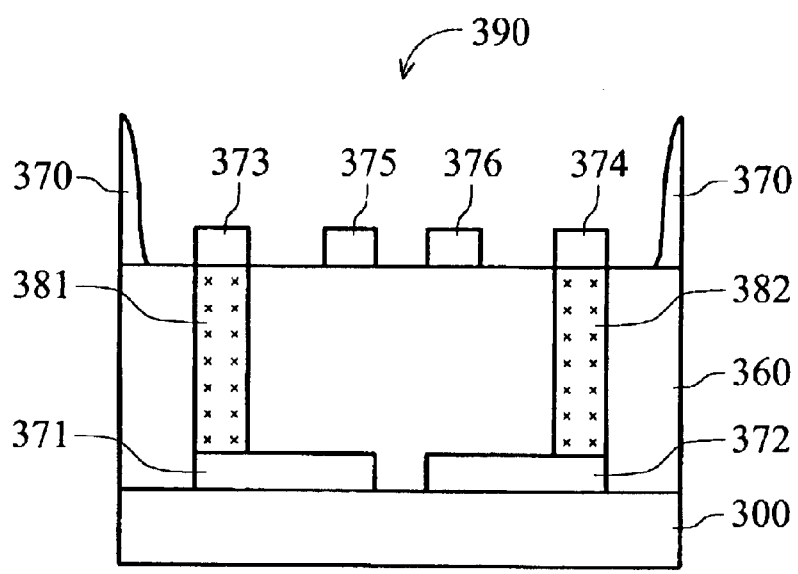

A fuse structure of the first embodiment is shown with FIG. 3A, FIG. 3B, FIG. 3C and FIG. 3D. FIG. 3A is top view of the fuse window of the present invention. FIGS. 3B, 3C and 3D are sectional views of FIG. 3A. FIG. 3B is a cross section of the first vertical line of FIG. 3A. FIG. 3C is a cross section of the second vertical line of FIG. 3A. FIG. 3D is a cross section of the second horizontal line of FIG. 3A.

In the first embodiment, the first horizontal line H1, the second horizontal line H2, and the third horizontal line are arranged in order. The first vertical line V1, the second vertical line V2, the third vertical line V3 and the fourth vertical line are arranged in order. The second vertical line V2 is close to the third vertical line V3, to increase the distance between the first vertical line V1 and the second vertical line V2, and the distance between the third vertical line V3 and the fourth vertical line V4.

FIG. 3B shows a substrate 300. In FIG. 3A, a first conductive layer 371 is formed on part of the substrate 300. The first conductive layer 371 starts from the third horizontal line H3 along the second vertical line V2 towards the third direction C, extends to the second horizontal line H2, turning towards the second direction B, and extends to the first vertical line V1. A second conductive layer 372 is formed on part of the substrate 300. The second conductive layer 372 starts from the third horizontal line H3 along the third vertical line V3 towards the third direction C, extends to the second horizontal line, H2 turning towards the first direction A, and extends to the fourth vertical line V4. The first conductive layer 371 and the second conductive layer 372 are tungsten or polysilicon. In FIG. 3B, a dielectric layer 360 is formed on the substrate 300, the first conductive layer 371 and the second conductive layer 372. The dielectric layer 360 is $SiO_2$. In FIG. 3D the openings are formed on the dielectric layer 360 to expose the first conductive layer 371 and near laser spot 310 side of the second conductive plug 372, to put into a first conductive plug 381 and a second conductive plug 382. The first conductive plug 381 and the second conductive plug 382 are tungsten or polysilicon.

FIGS. 3A and 3B show the laser spot 310, a third conductive layer 373, a fourth conductive layer 374, a fifth conductive layer 375 and a sixth conductive layer 376 is formed on the dielectric layer 360. The third conductive layer 373 is formed on part of the dielectric layer 360, wherein a layout of the third conductive starts from the first horizontal line H1 along the first vertical line V1 towards the fourth direction D, extending to the second horizontal line H2. A fourth conductive layer 374 is formed on part of the dielectric layer 360, wherein a layout of the fourth conductive layer 374 starts from the first horizontal line H1 along the fourth vertical line V4 towards the fourth direction D, extending to the second horizontal line H2. A fifth conductive layer 375 is formed on part of the dielectric layer 360, wherein a layout of the fifth conductive layer 375 starts from the third horizontal line H3 along the first vertical line V1, towards the third direction C, extends near to the second horizontal line H2, turns towards the first direction A, extends to an intersection of the second vertical line V2 and the second horizontal line H2 turns towards the third direction C, and ends at the first horizontal line H1.

A sixth conductive layer 376 is formed on part of the dielectric layer 360, wherein a layout of the sixth conductive layer 376 starts from the third horizontal line H3 along the fourth vertical line V4, towards the third direction C, extends near to the second horizontal line H2, turns toward the second direction B, extends to an intersection of the third vertical line V3 and the second horizontal line H2, turns toward the third direction C and ends at the first horizontal line H1.

The third conductive layer 373, the fourth conductive layer 374, the fifth conductive layer 375 and the sixth conductive layer 376 are aluminum, copper-aluminum or polysilicon. A first conductive plug 381 penetrating the dielectric layer 360, to electrically connect the third conductive layer 373 and the first conductive layer 371. A second conductive plug 382 electrically connects the fourth conductive layer 374 and the second conductive layer 372. The passivation layer is PE-TEOS $SiO_2$ or $Si_3N_4$.

FIG. 3A is a top view of fuse window of the present invention. The fuse windows 390 have a plurality of fuse structures (FIG. 3A only shows one fuse structure). Each fuse structure comprises fuse unit 320, fuse unit 330, fuse unit 340, fuse unit 350, each with its own laser spot 310. The fuse units 320, 330, 340, 350 do not electrically connect to each other. A first laser spot is formed on the third conductive layer 373 of the first vertical line. A second laser spot is formed on the fifth conductive layer 375 of the first vertical line. A third laser spot is formed on the fourth conductive layer 374 of the fourth vertical line. A fourth laser spot is formed on the sixth conductive layer 376 of the fourth vertical line.

Figure 1:
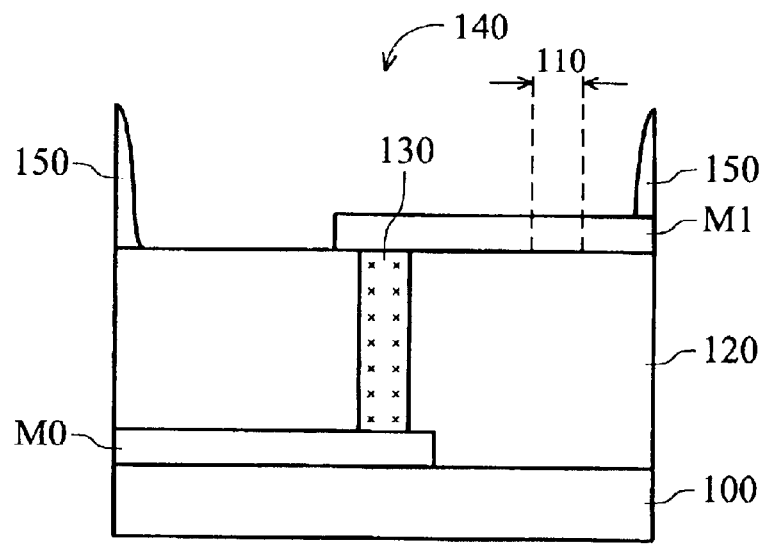
FIG. 1 is a sectional view of a traditional fuse structure.
Figure 2:
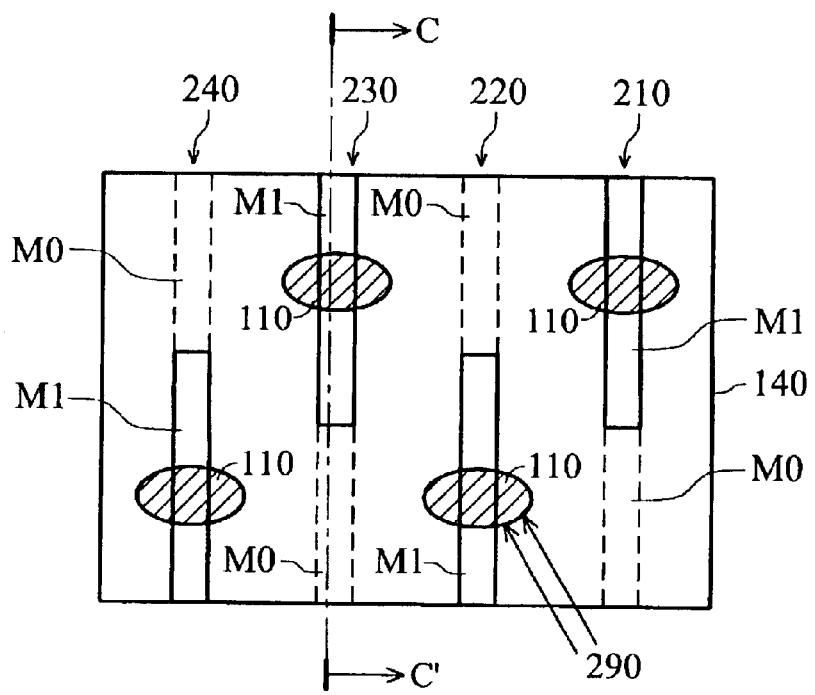
FIG. 2 is a sectional view of a traditional fuse window, and shows a top view of FIG. 1.

FIG. 3A, FIG. 3B, and FIG. 3C laser beam 290 blows the laser spot 310 in the fifth conductive layer 375 of the fuse unit 350. Misalignment of the laser beam 290 or thermal shock from the laser blow process can damage part of the first conductive layer 371. FIG. 2 shows a traditional fuse structure in the same fuse area comprising four fuse units. The distance between fuse units of the first embodiment is more than the prior art, thus experiencing less damage from the laser blow process. In first embodiment of the present invention the distance between the laser spot 310 of the fuse unit 350 and adjacent to the first conductive layer 371 is 1.33 times that prior of the art.

Figure 4A:
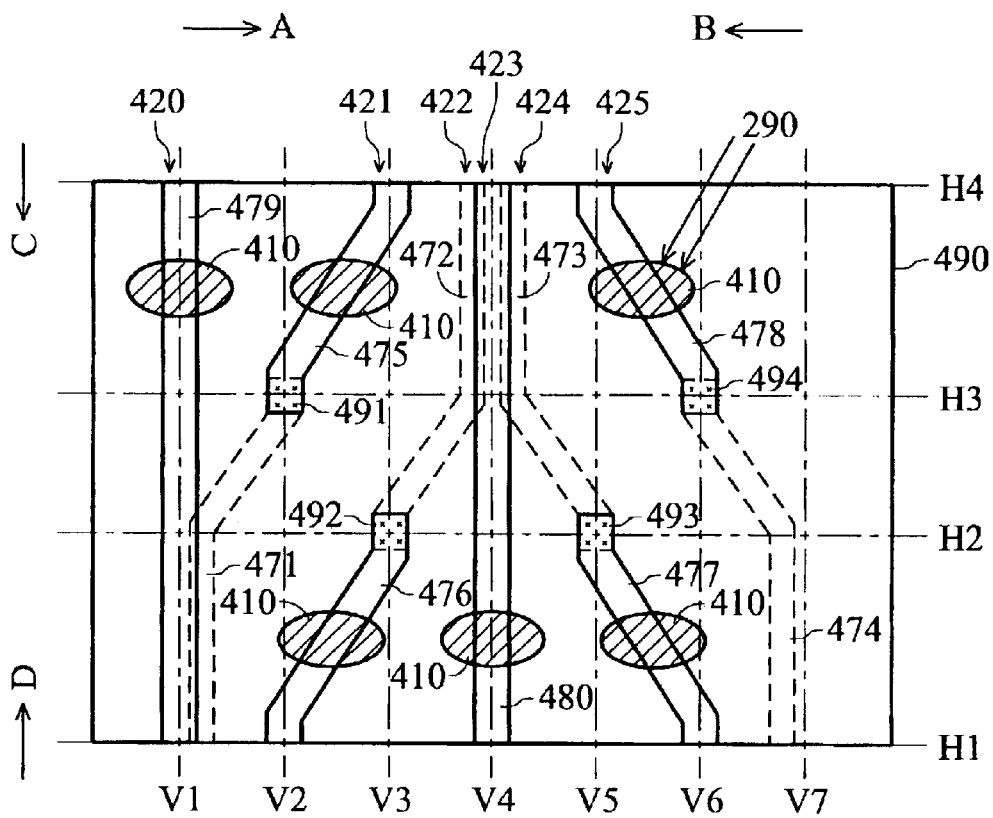
Figure 4B:
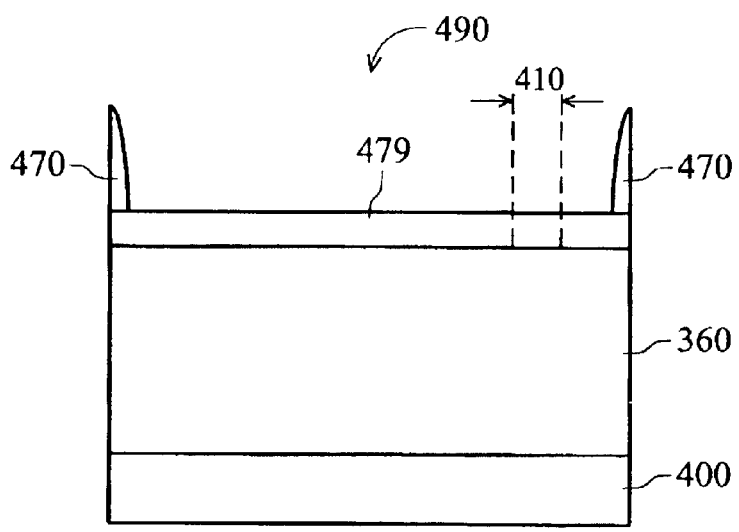
FIGS. 4B, 4C and 4D are sectional views of the FIG. 4A.
Figure 4C:
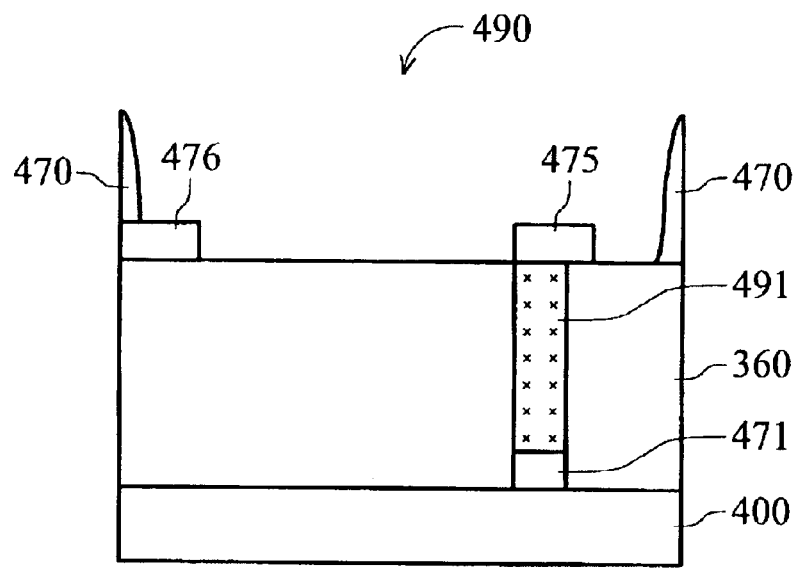
Figure 4D:
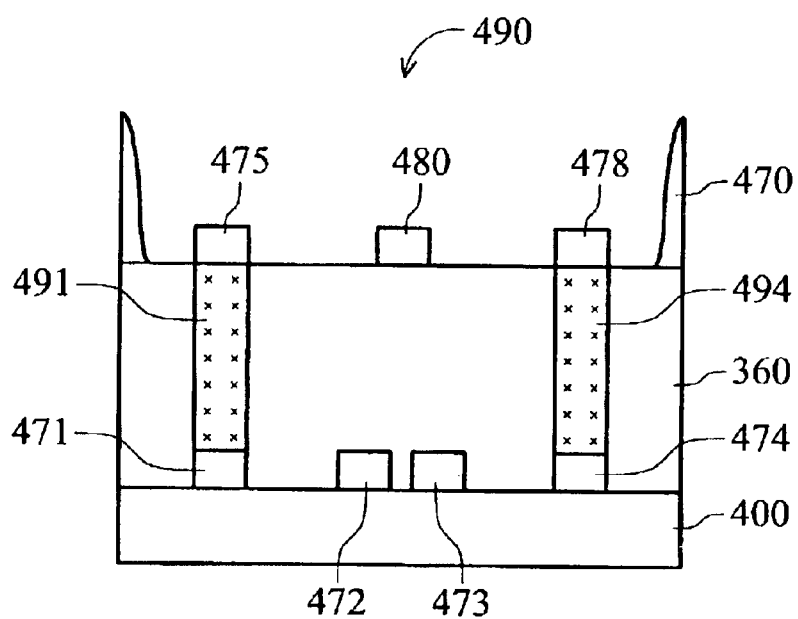

The second embodiment of the present invention is depicted in FIG. 4A, FIG. 4B, FIG. 4C and FIG. 4D. FIG. 4A is a top view of the fuse window of the present invention. FIGS. 4B, 4C and 4D are sectional views of FIG. 4A. FIG. 4B shows a cross section of the first vertical line of FIG. 4A. FIG. 4C shows a cross section of the second vertical line of FIG. 4A. FIG. 4D shows a cross section of the third vertical line of FIG. 4A.

In the second embodiment, the first horizontal line H1 the second horizontal line H2 the third horizontal line H3 and the fourth horizontal line H4 are arranged in order. The first vertical line V1, the second vertical line V2, the third vertical line V3, the fourth vertical line V4 the fifth vertical line V5, the sixth vertical line V6 and the seventh vertical line V7 are arranged in order.

In FIG. 4B shows a substrate 400. In FIG. 4A an eleventh conductive layer 471 (dotted line) is formed on the substrate 400, wherein a layout of eleventh conductive layer 471 starts from the first horizontal line H1 along the first vertical line V1 towards the fourth direction D, extended to the second horizontal line H2, turning towards an intersection of the second vertical line V2 and the third horizontal line H3. A twelfth conductive layer 472 (dotted line) is formed on part of the substrate 400, wherein a layout of twelfth conductive layer 472 starts from the fourth horizontal line H4 along the fourth vertical line V4 towards third direction C, extending to the third horizontal line H3, turning towards an intersection of the third vertical line V3 and the second horizontal line H2. A thirteenth conductive layer 473 (dotted line) is formed on part of the substrate 400, wherein a layout of thirteenth conductive layer 473 starts from the fourth horizontal line H4 along the fourth vertical line V4 towards third direction C, extending to the third horizontal line H3, turning towards an intersection of the fifth vertical line V5 and the second horizontal line H2. A fourteenth conductive layer 474 (dotted line) is formed on part of the substrate 400, wherein a layout of fourteenth conductive layer 474 starts from the first horizontal line H1 along the seventh vertical line V7 towards fourth direction D, extending to the second horizontal line H2, turning towards an intersection of the sixth vertical line v6 and the third horizontal line H3. The seventh conductive layer 471, the twelfth conductive layer 472, the thirteenth conductive layer 472 and the fourteenth conductive layer 474 are tungsten or polysilicon. In FIG. 4B a dielectric layer 360 is formed on the substrate 300, the seventh conductive layer 471, the twelfth conductive layer 472, the thirteenth conductive layer 472 and the fourteenth conductive layer 474. The dielectric layer 360 is $SiO_2$ In FIG. 4D the openings are formed on the dielectric layer 360 to expose the seventh conductive layer 471 and near laser spot 410 side of the fourteenth conductive plug 474, to put into a eleventh conductive plug 491 and a fourteenth conductive plug 494. The eleventh conductive plug 491 and the fourteenth conductive plug 494 are tungsten or polysilicon. The openings are formed on the dielectric layer 360 to expose the twelfth conductive layer 472 and near laser spot 410 side of the thirteenth conductive plug 473, to put into a twelfth conductive plug 492 and a thirteenth conductive plug 493. The twelfth conductive plug 492 and the thirteenth conductive plug 493 are tungsten or polysilicon.

In FIG. 4A a fifteenth conductive layer 475, a sixteenth conductive layer 476, a seventeenth conductive layer 477, a eighteenth conductive layer 478, a nineteenth conductive layer 479 and a twentieth conductive layer are formed on the dielectric layer 360 and part of the laser spot 410. A fifteenth conductive layer 375 is formed on part of the dielectric layer 360, wherein a layout of the fifteenth conductive layer 375 starts from an intersection of the third vertical line V3 and fourth horizontal line H4, extending to an intersection of the second vertical line V2 and the third horizontal line H3. A sixteenth conductive layer 476 is formed on part of the dielectric layer 360, wherein a layout of the sixteenth conductive layer 476 starts from an intersection of the second vertical line V2 and first horizontal line H1, extending to an intersection of the third vertical line V3 and the second horizontal line H2. A seventeenth conductive layer 477 is formed on part of the dielectric layer 360, wherein a layout of the seventeenth conductive layer 477 starts from an intersection of the sixth vertical line V6 and the first horizontal line H1, extending to an intersection of the fifth vertical line V5 and the second horizontal line H2. An eighteenth conductive layer 478 is formed on part of the dielectric layer 360, wherein a layout of the eighteenth conductive layer 478 starts from an intersection of the fifth vertical line V5 and the fourth horizontal line H4, extending to an intersection of the sixth vertical line V6 and the third horizontal line H3. A nineteenth conductive layer 479 is formed on part of the dielectric layer 360, wherein a layout of the nineteenth conductive layer 479 starts from the first horizontal line H1 along the first vertical line V1 towards fourth direction D, extending to the fourth horizontal line H4. A twentieth conductive layer 480 is formed on part of the dielectric layer 360, wherein a layout of the twentieth conductive layer 480 starts from the first horizontal line H1 along the fourth vertical line V4 towards the fourth direction D, extending to the fourth horizontal line H4. The fifteenth conductive layer 475, the sixteenth conductive layer 476, the seventeenth conductive layer 477, the eighteenth conductive layer 478, the nineteenth conductive layer 479 and the twentieth conductive layer are aluminum, copper-aluminum alloy or polysilicon. The eleventh conductive plug 491 electrically connects the fifteenth conductive layer 475 and eleventh conductive layer 471. The twelfth conductive plug 492 electrically connects the sixteenth conductive layer 476 and twelfth conductive layer 472. The thirteenth conductive plug 493 electrically connects the seventeenth conductive layer 477 and thirteenth conductive layer 473. The fourteenth conductive plug 494 electrically connects the eighteenth conductive layer 478 and fourteenth conductive layer 474. An angle between the fifteenth conductive layer 475 and the third horizontal line H3 is 15 to 75 degrees. An angle between the sixteenth conductive layer 476 and the first horizontal line H1 is 15 to 75 degrees. An angle between seventeenth conductive layer 477 and first horizontal line H1 is 105 to 165 degrees. An angle between eighteenth conductive layer 478 and third horizontal line H3 is 105 to 165 degree. The passivation layer is PE-TEOS $SiO_2$ or $Si_3N_4$.

FIG. 4A is a top view of the fuse structure of the present invention. The fuse windows 490 have a plurality of fuse structures (FIG. 4A only shows one fuse structure). Each fuse structure comprises six fuse units, fuse unit 420, fuse unit 421, fuse unit 422, fuse unit 423, fuse unit 424 and fuse unit 425. Each fuse unit has its own laser spot 410. Fuse units 420, 421, 422, 423, 424, 425 do not electrically connect to each other. An eleventh laser spot is formed on the fifteenth conductive layer 475. A twelfth laser spot is formed on the nineteenth conductive layer 479. A thirteenth laser spot is formed on the sixteenth conductive layer 476. A fourteenth laser spot is formed on the twentieth conductive layer 480. A fifteenth laser spot is formed on the seventeenth conductive layer 477. A sixteenth laser spot is formed on the eighteenth conductive layer 478.

Figure 4E:
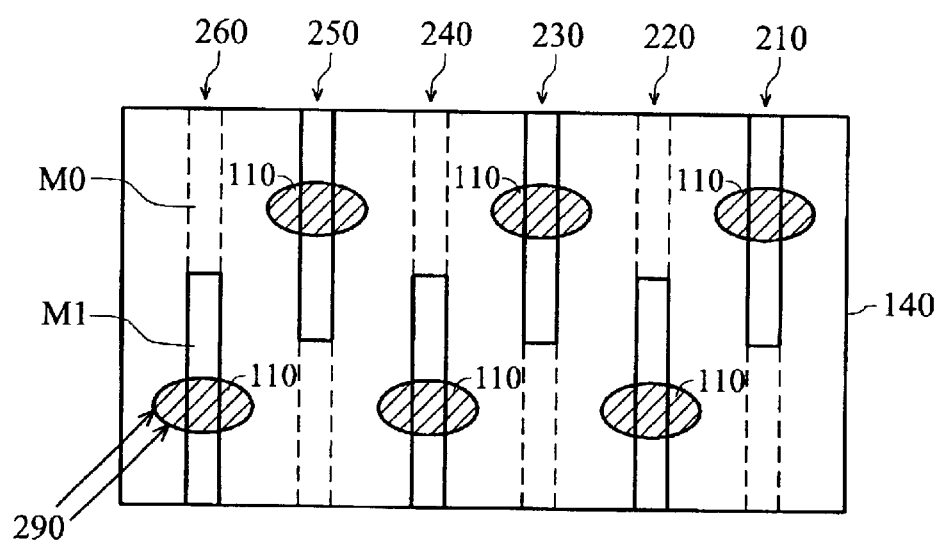
FIG. 4E is a top view of a traditional fuse structure.

In FIG. 4A, FIG. 4B, and FIG. 4C, laser beam 290 blows the laser spot 410 in the fuse unit 425 of the eighteenth conductive layer 478. Misalignment of the laser beam 290 or thermal shock from the laser blow process can damage part of the thirteenth conductive layer 473. FIG. 4E shows a traditional fuse structure in the same fuse area comprising six fuse units. The distance between fuse units of the second embodiment is longer than the prior art, thus allowing less damage from the laser blow process. In the second embodiment of the present invention the distance between the laser spot 410 of the fuse unit 425 and adjacent the thirteenth conductive layer 473 is 1.5 times that in the prior art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A fuse structure, comprising:
   a substrate;
   a first conductive layer formed on part of the substrate, wherein a layout of the first conductive layer starts from a third horizontal line along a second vertical line towards a third direction, extends to the second horizontal line turning towards the second direction, and extends to a first vertical line;
   a second conductive layer formed on part of the substrate, wherein a layout of the second conductive layer starts from a third horizontal line along a third vertical line towards the third direction, extends to the second horizontal line turning towards the first direction, and extends to a fourth vertical line;
   a dielectric layer formed on the first conductive layer, the second conductive layer and on part of the structure;
   a third conductive layer formed on part of the dielectric layer, wherein a layout of the third conductive layer starts from first horizontal line along the first vertical line towards the fourth direction, and extends to the second horizontal line;
   a fourth conductive layer formed on part of the dielectric layer, wherein a layout of the fourth conductive layer starts from the first horizontal line alone the fourth vertical line towards the fourth direction, and extends to the second horizontal line;
   a fifth conductive layer formed on part of the dielectric layer, wherein a layout of the fifth conductive layer starts from the third horizontal line along the first vertical line towards the third direction, extends near to the second horizontal line, turns toward the first direction, extends to an intersection of the second vertical line and the second horizontal line, turning towards the third direction, and ends at the first horizontal line;
   a sixth conductive layer formed on part of the dielectric layer, wherein a layout of the sixth conductive layer starts from the third horizontal line along the fourth vertical line towards the third direction, extends near to the second horizontal line, turns towards the second direction, extends to an intersection of the third vertical line and the second horizontal line, turning towards to the third direction and ends at the first horizontal line;
   a first conductive plug formed on an intersection of the second vertical line and the second horizontal line penetrating the dielectric layer to electrically connect the first conductive layer and the third conductive layer; and
   a second conductive plug formed on an intersection of the fourth vertical line and the second horizontal line penetrating the dielectric layer to electrically connect the second conductive layer and the fourth conductive layer.

2. The fuse structure according to claim 1, wherein the first, second and third horizontal and vertical lines are arranged in order, as is the vertical line, the distance between the first vertical line and the second vertical line is longer than the distance between the second vertical line and third vertical line, and the distance between third vertical line and the fourth vertical line is longer than the distance between the second vertical line and the third vertical line.

3. The fuse structure according to claim 1, wherein the first conductive layer and the second conductive layer are tungsten or polysilicon.

4. The fuse structure according to claim 1, wherein the third conductive layer, the fourth conductive layer, the fifth conductive layer and the sixth conductive layer are aluminum, copper-aluminum alloy or polysilicon.

5. The fuse structure according to claim 1, wherein the first conductive plug and the second conductive plug are tungsten or polysilion.

6. The fuse structure according to claim 1, wherein the dielectric layer is SiO2.

7. A fuse window having a plurality of fuse structures, each comprising:
   a substrate;
   a first conductive layer formed on part of the substrate, wherein a layout of the first conductive layer starts from a third horizontal line along a second vertical line in a third direction, extends to a second horizontal line turning towards the second direction, and extending to a first vertical line;
   a second conductive layer formed on part of the substrate, wherein a layout of the second conductive layer starts from the third horizontal line along a third vertical line to the third direction, extends to the second horizontal line turning towards the first direction, and extends to a fourth vertical line;
   a dielectric layer formed on the first conductive layer, the second conductive layer and part of the structure;
   a third conductive layer formed on part of the dielectric layer, wherein a layout of the third conductive starts from the first horizontal line along the first vertical line towards the fourth direction, and extends to the second horizontal line;
   a fourth conductive layer formed on part of the dielectric layer, wherein a layout of the fourth conductive layer starts from the first horizontal line along the fourth vertical line towards the fourth direction, and extends to the second horizontal line;
   a fifth conductive layer formed on part of the dielectric layer, wherein a layout of the fifth conductive layer starts from the third horizontal line along the first vertical line toward the third direction, extends near to the second horizontal line, turns towards the first direction, extends to an intersection of the second vertical line and the second horizontal line turns towards the third direction, and ends at the first horizontal line;
   a sixth conductive layer formed on part of the dielectric layer, wherein a layout of the sixth conductive layer starts from the third horizontal line along the fourth vertical line towards the third direction, extends near to the second horizontal line, turns towards the second direction, extends to an intersection of the third vertical line and the second horizontal line, turns towards to the third direction and ends at the first horizontal line;
   a first conductive plug formed on an intersection of the second vertical line and the second horizontal line penetrating the dielectric layer to electrically connect a first conductive layer and the third conductive layer;
   a second conductive plug formed on an intersection of the fourth vertical line and the second horizontal line penetrating the dielectric layer to electrically connect the second conductive layer and the fourth conductive layer;
   a first laser spot formed on the third conductive layer of a first vertical line;
   a second laser spot formed on the fifth conductive layer of a first vertical line;
   a third laser spot formed on the fourth conductive layer of the fourth vertical line;
   a fourth laser spot formed on the sixth conductive layer of a fourth vertical line, wherein the fuse structures of the fuse window each has a laser spot, and the fuse structures do not electrically connect to each other; and
   the fuse structure comprising four fuse units, where in the first conductive layer electrically connected to the third conductive layer is a fuse unit, the second conductive layer electrically connected to the forth conductive layer is a fuse unit, the fifth conductive layer is a fuse unit, and the sixth conductive layer is a fuse unit.

8. The fuse window according to claim 7, wherein the first conductive layer and the second conductive layer is aluminum or polysilicon.

9. The fuse window according to claim 7, wherein the third conductive layer, the fourth conductive layer, the fifth conductive layer and the sixth conductive layer are aluminum, copper-aluminum or polysilicon.

10. The fuse window according to claim 7, wherein the first conductive plug and the second conductive plug are tungsten or posilicon.

11. The fuse window according to claim 7, wherein the dielectric layer is SiO2.

12. A fuse structure comprising:
   a substrate;
   an eleventh conductive layer formed on part of the substrate, wherein a layout of the eleventh conductive layer starts from a first horizontal line along a first vertical line towards the fourth direction, extends to a second horizontal line, and turning towards an intersection of a second vertical line and a third horizontal line;
   a twelfth conductive layer formed on part of the substrate, wherein a layout of the twelfth conductive layer starts from a fourth horizontal line along a fourth vertical line towards a third direction, and extends to a third horizontal line, turning towards an intersection of a third vertical line and a second horizontal line;
   a thirteenth conductive layer formed on part of the substrate, wherein a layout of a thirteenth conductive layer starts from a fourth horizontal line along a fourth vertical line towards a third direction, and extends to a third horizontal line, turning towards an intersection of a fifth vertical line and a second horizontal line;
   a fourteenth conductive layer formed on part of the substrate, wherein a layout of fourteenth conductive layer starts from a first horizontal line along a seventh vertical line towards a fourth direction, and extends to a second horizontal line, turning towards an intersection of a sixth vertical line and a third horizontal line;
   a dielectric layer is formed on the eleventh conductive layer, the twelfth conductive layer, the thirteenth conductive layer, the fourteenth conductive layer and part of the substrate;
   a fifteenth conductive layer formed on part of the dielectric layer, wherein a layout of the fifteenth conductive layer starts from an intersection of a third vertical line and a fourth horizontal line, and extends to an intersection of a second vertical line and a third horizontal line;
   a sixteenth conductive layer formed on part of the dielectric layer, wherein a layout of the sixteenth conductive layer starts from an intersection of a second vertical line and a first horizontal line, and extends to an intersection of a third vertical line and a second horizontal line;

a seventeenth conductive layer formed on part of the dielectric layer, wherein a layout of the seventeenth conductive layer starts from an intersection of a sixth vertical line and a first horizontal line, and extends to an intersection of a fifth vertical line and a second horizontal line;

an eighteenth conductive layer formed on part of the dielectric layer, wherein a layout of the eighteenth conductive layer starts from an intersection of a fifth vertical line and a fourth horizontal line, and extends to an intersection of a sixth vertical line and a third horizontal line;

a nineteenth conductive layer formed on part of the substrate, wherein a layout of the nineteenth conductive layer starts from a first horizontal line along a first vertical line toward a fourth direction, and extends to a fourth horizontal line;

a twentieth conductive layer formed on part of the substructure, wherein a layout of the twentieth conductive layer starts from a first horizontal line along a fourth vertical lone towards the fourth direction, and extends to a fourth horizontal line;

an eleventh conductive plug formed on an intersection of the second vertical line and the third horizontal line penetrating the dielectric layer to electrically connect the eleventh conductive layer and fifteenth conductive layer;

a twelfth conductive plug formed on an intersection of the third vertical line and a second horizontal line penetrating the dielectric layer to electrically connect the twelfth conductive layer and sixteenth conductive layer;

a thirteenth conductive plug formed on an intersection of the fifth vertical line and the second horizontal line penetrating the dielectric layer to electrically connect the thirteenth conductive layer and the seventeenth conductive layer; and a fourteenth conductive plug formed on an intersection of the sixth vertical line and the third horizontal line penetrating the dielectric layer to electrically connect the eighteenth conductive layer and the fourteenth conductive layer.

13. The fuse structure according to claim 12, wherein the first horizontal line, the second horizontal line, the third horizontal line and fourth horizontal line, and the first vertical line, the second vertical line, third vertical line, fourth vertical line, sixth vertical line and seven vertical line are arranged in order.

14. The fuse structure according to claim 12, wherein an angle between the fifteenth conductive layer and the third horizontal line is 15 to 75 degrees, an angle between the sixteenth conductive layer and the first horizontal line is 15 to 75 degree, an angle between the seventeenth conductive layer and the first horizontal line is 105 to 165 degrees, and an angle between the eighteenth conductive layer and the third horizontal line is 105 to 165 degree.

15. The fuse structure according to claim 12, wherein the eleventh conductive layer, the twelfth conductive layer, the thirteenth conductive layer and the fourteenth conductive layer are tungsten or polysilicon.

16. The fuse structure according to claim 12, wherein the fifteenth conductive layer, the sixteenth conductive layer, the seventeenth conductive layer, the eighteenth conductive layer, the nineteenth conductive layer and the twentieth conductive layer are aluminum, copper-aluminum alloy or polysilicon.

17. The fuse structure according to claim 12, wherein the eleventh conductive plug, the twelfth conductive plug, the thirteenth conductive plug and the fourteenth plug are tungsten or polysilicon.

18. The fuse structure according to claim 12, wherein the dielectric layer is SiO2.

19. A fuse window having a plurality of fuse structure, each of the fuse structures comprising:

a substrate;

an eleventh conductive layer formed on part of the substrate, wherein a layout of the eleventh conductive starts from a first horizontal line along a first vertical line towards the fourth direction, and extends to a second horizontal line, turning toward an intersection of a second vertical line and a third horizontal line;

a twelfth conductive layer formed on part of the substrate, wherein a layout of the twelfth conductive layer starts from a fourth horizontal line along a fourth vertical line toward third direction, and extends to the third horizontal line, turning towards an intersection of a third vertical line and the second horizontal line;

a thirteenth conductive layer formed on part of the substrate, wherein a layout of the thirteenth conductive layer starts from the fourth horizontal line along the fourth vertical line toward a third direction, and extends to the third horizontal line, turning towards an intersection of a fifth vertical line and the second horizontal line;

a fourteenth conductive layer formed on part of the substrate, wherein a layout of the fourteenth conductive layer starts from the first horizontal line along a seventh vertical line toward fourth direction, and extends to the second horizontal line, turning towards an intersection of a sixth vertical line and the third horizontal line;

a dielectric layer formed on the eleventh conductive layer, the twelfth conductive layer, the thirteenth conductive layer, the fourteenth conductive layer and part of the substrate;

a fifteenth conductive layer formed on part of the dielectric layer, wherein a layout of the fifteenth conductive layer starts from an intersection of the third vertical line and fourth horizontal line, and extends to an intersection of the second vertical line and the third horizontal line;

a sixteenth conductive layer formed on part of the dielectric layer, wherein a layout of the sixteenth conductive layer starts from an intersection of the second vertical line and first horizontal line, and extends to an intersection of the third vertical line and the second horizontal line;

a seventeenth conductive layer formed on part of the dielectric layer, wherein a layout of the seventeenth conductive layer starts from an intersection of the sixth vertical line and the first horizontal line, and extends to an intersection of the fifth vertical line and the second horizontal line;

an eighteenth conductive layer formed on part of the dielectric layer, wherein a layout of the eighteenth conductive layer starts from an intersection of the fifth vertical line and the fourth horizontal line, and extends to an intersection of the sixth vertical line and the third horizontal line;

a nineteenth conductive layer formed on part of the substrate, wherein a layout of the nineteenth conductive layer starts from the first horizontal line along the first vertical line toward fourth direction, and extends to the fourth horizontal line;

a twentieth conductive layer formed on part of the substrate, wherein a layout of the twentieth conductive layer starts from the first horizontal line along the fourth vertical line towards the fourth direction, and extends to the fourth horizontal line;

an eleventh conductive plug formed on an intersection of the second vertical line and third horizontal line penetrating the dielectric layer to electrically connect the eleventh conductive layer and fifteenth conductive layer;

a twelfth conductive plug formed on an intersection of the third vertical line and second horizontal line penetrating the dielectric layer to electrically connect the twelfth conductive layer and sixteenth conductive layer;

a thirteenth conductive plug formed on an intersection of the fifth vertical line and second horizontal line penetrating the dielectric layer to electrically connect the thirteenth conductive layer and seventeenth conductive layer;

a fourteenth conductive plug formed on an intersection of the sixth vertical line and third horizontal line penetrating the dielectric layer to electrically connect the eighteenth conductive layer and fourteenth conductive layer;

a eleventh laser spot formed on the fifteenth conductive layer;

a twelfth laser spot formed on the nineteenth conductive layer;

a thirteenth laser spot formed on the sixteenth conductive layer;

a fourteenth laser spot formed on the twentieth conductive layer;

a fifteenth laser spot formed on the seventeenth conductive layer;

a sixteenth laser spot formed on the eighteenth conductive layer;

in the fuse window having a plurality of fuse structures, each fuse structure comprises six fuses, each fuse unit has its own laser spot, the fuse units do not electrically connect to each other, the eleventh conductive layer is electrically connected to a fifteenth conductive layer is a fuse unit, the twelfth conductive layer electrically connecting a sixteenth conductive layer is a fuse unit, the thirteenth conductive layer electrically connecting a seventeenth conductive layer is a fuse unit, the fourteenth conductive layer electrically connecting an eighteenth conductive layer is a fuse unit, the nineteenth conductive layer is a fuse unit, and the twentieth conductive layer is a fuse unit.

* * * * *